(12) United States Patent
Shinohara et al.

(10) Patent No.: US 10,388,746 B2
(45) Date of Patent: Aug. 20, 2019

(54) FET WITH BURIED GATE STRUCTURE

(71) Applicant: Teledyne Scientific & Imaging, LLC, Thousand Oaks, CA (US)

(72) Inventors: Keisuke Shinohara, Thousand Oaks, CA (US); Miguel Urteaga, Moorpark, CA (US); Casey King, Ventura, CA (US); Andy Carter, Thousand Oaks, CA (US)

(73) Assignee: Teledyne Scientific & Imaging, LLC, Thousand Oaks, CA (US)

( * ) Notice: Subject to any disclaimer, the term of this patent is extended or adjusted under 35 U.S.C. 154(b) by 0 days.

(21) Appl. No.: 15/643,343

(22) Filed: Jul. 6, 2017

(65) Prior Publication Data

US 2019/0013386 A1    Jan. 10, 2019

(51) Int. Cl.
| | |
|---|---|
| *H01L 29/40* | (2006.01) |
| *H01L 29/423* | (2006.01) |
| *H01L 29/778* | (2006.01) |
| *H01L 29/47* | (2006.01) |
| *H01L 29/24* | (2006.01) |

(Continued)

(52) U.S. Cl.
CPC .... *H01L 29/42316* (2013.01); *H01L 29/0619* (2013.01); *H01L 29/1606* (2013.01); *H01L 29/24* (2013.01); *H01L 29/402* (2013.01); *H01L 29/47* (2013.01); *H01L 29/778* (2013.01); *H01L 29/7783* (2013.01); *H01L 29/7786* (2013.01); *H01L 29/8128* (2013.01); *H01L 29/0649* (2013.01); *H01L 29/1066* (2013.01);

(Continued)

(58) Field of Classification Search
CPC ............ H01L 29/402; H01L 29/42312; H01L 29/42316; H01L 29/47; H01L 29/778; H01L 29/7786
USPC ........................................ 257/190, 192, 194
See application file for complete search history.

(56) References Cited

U.S. PATENT DOCUMENTS

| | | |
|---|---|---|
| 4,503,600 A | 3/1985 | Nii et al. |
| 5,705,412 A | 1/1998 | Aklufi |

(Continued)

FOREIGN PATENT DOCUMENTS

KR      20120010512      2/2012

OTHER PUBLICATIONS

International Search Report and Written Opinion for International Application No. PCT/US2018/040931 dated Oct. 18, 2018.

(Continued)

*Primary Examiner* — Matthew E Warren
(74) *Attorney, Agent, or Firm* — M.J. Ram and Associates (57) ABSTRACT

A FET with a buried gate structure. The FET's gate electrode comprises a plurality of buried gate structures, the tops of which extend above the substrate's top surface and the bottoms of which are buried to a depth at least equal to that of the bottom of the channel layer, or the 2DEG plane within a channel layer for a HEMT, such that the buried gate structures contact the channel layer only from its sides. A head portion above and not in contact with the substrate's top surface contacts the tops of and interconnects all of the buried gate structures. Drain current is controlled by channel width modulation by lateral gating of the channel layer by the buried gates structures. The FET may include at least one field plate which comprises a slit structure in which the field plate is divided into segments.

24 Claims, 6 Drawing Sheets

(51) Int. Cl.
*H01L 29/16* (2006.01)
*H01L 29/812* (2006.01)
*H01L 29/06* (2006.01)
*H01L 29/417* (2006.01)
*H01L 29/20* (2006.01)
*H01L 29/10* (2006.01)

(52) U.S. Cl.
CPC .... *H01L 29/2003* (2013.01); *H01L 29/41758* (2013.01); *H01L 29/4236* (2013.01)

(56) References Cited

U.S. PATENT DOCUMENTS

| | | | |
|---|---|---|---|
| 6,507,051 B1 * | 1/2003 | Hara | H01L 21/28587 257/192 |
| 6,600,192 B1 | 7/2003 | Sugawara et al. | |
| 8,610,191 B2 | 12/2013 | Moon et al. | |
| 8,796,762 B2 | 8/2014 | Lindsay et al. | |
| 8,900,939 B2 * | 12/2014 | Kub | H01L 29/778 257/194 |
| 8,980,714 B2 | 3/2015 | Lemke et al. | |
| 9,419,120 B2 | 8/2016 | Nechay et al. | |
| 9,419,121 B1 | 8/2016 | Teo et al. | |
| 2013/0168687 A1 * | 7/2013 | Kuo | H01L 29/2003 257/76 |
| 2014/0070228 A1 | 3/2014 | Palacios et al. | |
| 2015/0214362 A1 | 7/2015 | Oh | |
| 2015/0249134 A1 | 9/2015 | Ostermaier et al. | |
| 2015/0372081 A1 * | 12/2015 | Lee | H01L 29/66469 257/76 |
| 2016/0293713 A1 | 10/2016 | Nechay et al. | |
| 2017/0162650 A1 | 6/2017 | Cheng et al. | |

OTHER PUBLICATIONS

Dong Seup Lee et al., "Nanowire Channel InAlN/GaN HEMTs With High Linearity of $g_m$ and $f_T$", IEEE Electron Device Letters, pp. 969-971, vol. 34, No. 8, Aug. 2013.

Howell et al., "Advances in the Super-Lattice Castellated Field Effect Transistor (SLCFET) for Wideband Low Loss RF Switching Applications", IEEE, 2016.

* cited by examiner

FIG. 6b

US 10,388,746 B2

FET WITH BURIED GATE STRUCTURE

BACKGROUND OF THE INVENTION

Field of the Invention

This invention relates generally to field-effect transistors (FETs), and more particularly to FETs employing buried gate structures to control drain current through modulation of channel width by the use of a lateral gate electric field.

Description of the Related Art

In most conventional field effect transistors (FETs), the gate electrode is formed on the top of a semiconductor surface to modulate the drain current by the use of a vertical gate electric field. This forms a region at the drain end of the gate where electric field strength becomes the highest during high voltage operation. This is a primary cause of critical problems for conventional FETs. For example, current collapse caused by electron trapping at the drain end of the gate on the semiconductor surface is a commonly known problem which degrades RF power performance (output power, efficiency, linearity, gain) of FETs when they are operated to provide a large voltage swing. For GaN-based high electron mobility transistors (HEMTs) with strong piezoelectricity, the high vertical electric field at the drain end of the gate can cause cracks in the epitaxial layers by inducing tensile stress in the top barrier material (so-called "inverse piezoelectric effect"). This effect limits the reliability of GaN-based HEMTs.

Further problems can arise when operating FETs at high frequencies. For example, for conventional FETs, electrostatic isolation is degraded when the gate length is scaled down for high frequency operations ("short channel effects"). This limits a FET's gain, and can degrade its off-state leakage and breakdown voltage characteristics. Additionally, although a low knee voltage is preferred for high efficiency operation of power amplifiers (PAs) and low noise operation of low noise amplifiers (LNAs), knee voltage is largely limited by parasitic resistances arising from metal-semiconductor contact resistance and device access resistances. Ideally, when the drain-source voltage is low (in the ohmic region), all the voltage is applied only in the intrinsic active FET region for early channel pinch-off, without an excess voltage drop in parasitic resistances to decrease Vknee.

For high linearity operation, a gradual gm curve is preferred because abrupt change in the gin curve results in large gm derivatives (gm' & gm"), which degrade the transistor's linearity performance. In conventional HEMTs with a top gate contact, the gm curve typically shows a peak, which is due to their operation principle that uses electron density modulation by the vertical gate field. In conventional metal-semiconductor field-effect transistors (MESFETs), the gm curve is more gradual due to their mode of operation, but the electron velocity is lower than HEMTs due to increased scattering by ionized impurities in the channel, limiting their operational frequencies.

During high power operation of a FET, dissipated power turns into heat ("self-heating"). This limits output power, gain, and efficiency of PAs. In addition, an increased junction temperature reduces the lifetime of the transistors. In a conventional FET, the junction. temperature peaks at the drain end of the gate where the electric field is the highest, and the peak junction temperature increases with increasing device periphery, i.e., gate width.

SUMMARY OF THE INVENTION

A FET with a buried gate structure is presented, in which the buried gate structures contact the channel layer only from the sides. The gates do not contact the FET's top surface, and hence drain current is controlled only by channel width modulation. This unique structure and mode of operation enable improved electrostatics, breakdown voltage, and reliability, reduced leakage current and parasitic resistance, and suppressed surface trapping effects. High frequency performance, linearity, and self-heating characteristics may also be improved.

The present FET comprises a substrate, an epitaxial channel layer grown on the substrate, and source and drain electrodes on the substrate's top surface. The FET's gate electrode comprises a plurality of buried gate structures, the tops of which extend above the substrate's top surface and the bottoms of which are buried to a depth at least equal to the bottom of the two-dimensional electron gas (2DEG) plane in the channel layer (for a HEMT), or to a depth at least equal to the bottom of the channel layer (for a MESFET), such that the buried gate structures contact the channel layer only from its sides. The gate electrode further comprises a head portion above and not in contact with the substrate's top surface, which contacts the tops of and interconnects all of the buried gate structures. In this way, the FET's drain current is controlled by channel width modulation by lateral gating of the channel layer by the buried gates structures.

The distance between buried gate structures (i.e., "pitch") can be fixed or varied as needed to provide desired transfer characteristics for the FET, such as a desired threshold voltage. The present buried gate structure can be used with different types of FETs, including HEMTs and MESFETs. The present FET can further comprise at least one field plate between the gate and drain electrodes, with each field plate comprising a slit structure in which the segments of the field plate lie along a line which is parallel to and between the gate and drain electrodes.

These and other features, aspects, and advantages of the present invention will become better understood with reference to the following drawings, description, and claims.

DETAILED DESCRIPTION OF THE INVENTION

Figures 1A, 1B, 2A:
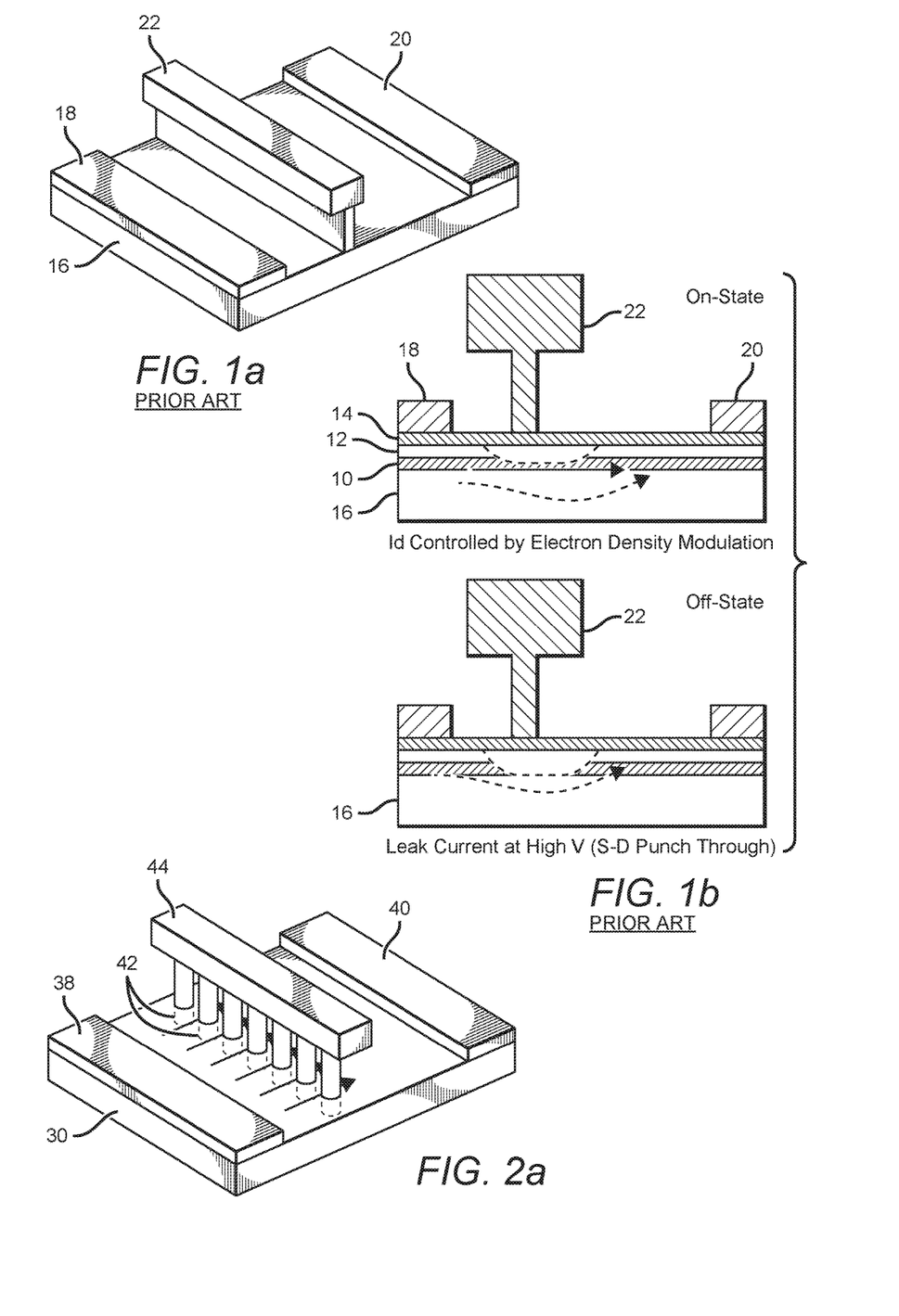
FIGS. 1a and 1b are perspective and sectional views of a conventional HEMT.
FIGS. 2a-2c are perspective, sectional, and plan views of a FET per the present invention.
Figure 2B:
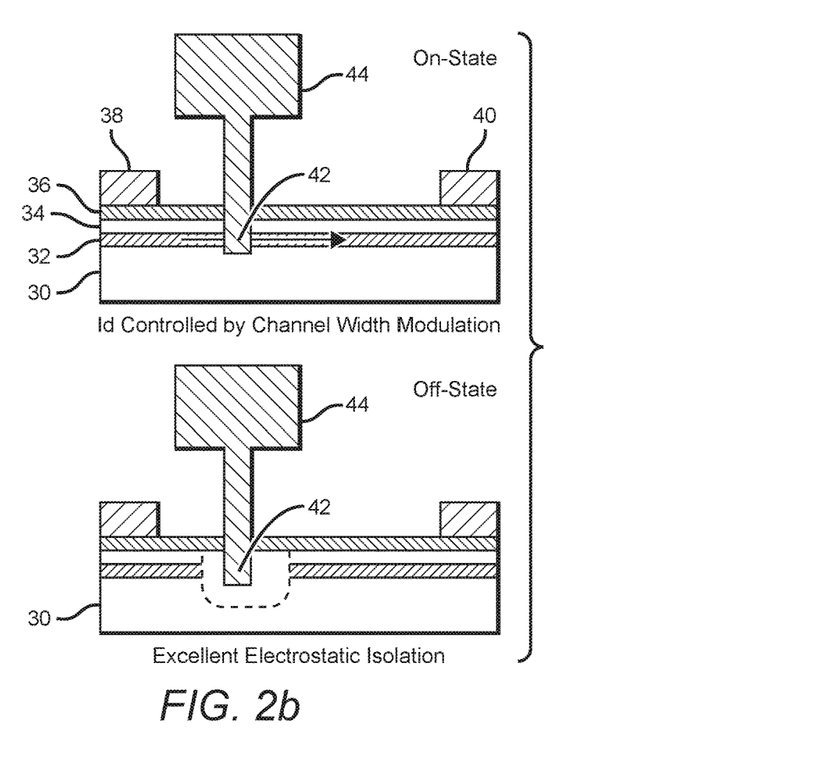
Figure 2C:
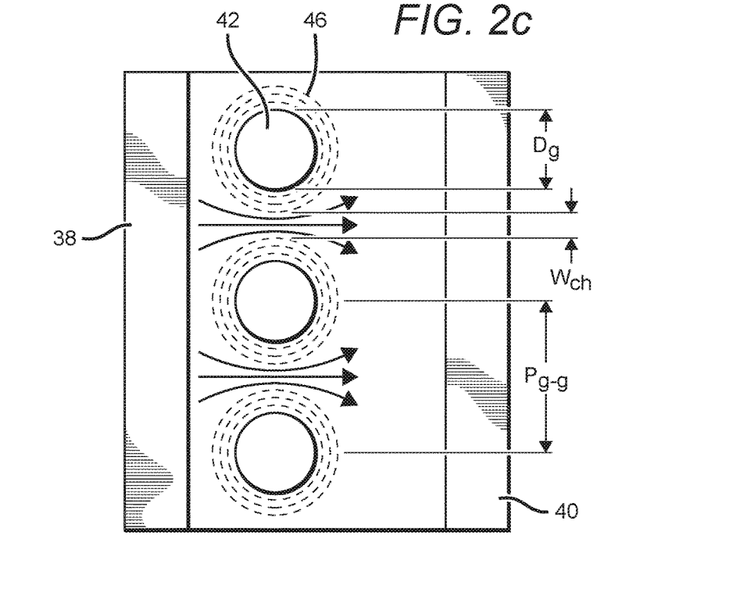

An exemplary embodiment of a conventional FET is shown in FIGS. 1a and 1b, and an embodiment of a FET with a buried gate structure, per the present invention, is illustrated in FIGS. 2a-2c. HEMTs are depicted in the examples shown, though the buried gate arrangement described herein could be applied to other FET types, including MESFETs and Metal Insulator Semiconductor FETs (MISFETs). In the conventional planar HEMT shown in FIGS. 1a and 1b, a buffer layer 10, a channel layer 12, and a top barrier layer 14 have been grown on a substrate 16. Source and drain electrodes 18 and 20 are on the substrate's top surface, along with a T-gate 22. Note that as used herein, the substrate's "top surface" refers to the surface of the uppermost epitaxial layer that has been grown on the substrate. In operation (illustrated in FIG. 1b), in the ON-state, a voltage applied to the T-gate creates a vertical electric field which affects the depletion of channel layer 12, thereby controlling the current flow between source and drain electrodes. Drain current is controlled by electron density modulation, with electrons flowing under the foot of T-gate 22. One drawback of this conventional design is that in the OFF-state, there may be a leakage current when the source-drain voltage is high, due to source-drain punch through.

One possible embodiment of a FET with a buried gate structure is shown in FIGS. 2a-2c. In this exemplary embodiment, the FET is a HEMT, in which drain current is carried via a 2DEG plane within the channel layer. The HEMT comprises a substrate 30, an epitaxial buffer layer 32, a 2DEG plane 34 within an epitaxial channel layer, an epitaxial top barrier layer 36, and source and drain electrodes 38, 40 on the substrate's top surface. However, instead of a T-gate electrode on the substrate surface as in FIGS. 1a and 1b, here the gate electrode comprises a plurality of buried gate structures 42, the tops of which extend above the substrate's top surface and the bottoms of which are buried to a depth at least equal to that of the bottom of 2DEG plane 34. The gate electrode also includes a head portion 44 above and not in contact with the substrate's top surface, which contacts and interconnects all of the buried gate structures. Thus, buried gate structures 42 contact 2DEG plane 34 only from the sides. When so arranged, the FET's drain current is controlled by channel width modulation by lateral gating of 2DEG plane 34 by buried gates structures 42. Now, as shown in FIG. 2b, drain current in the ON-state is controlled by channel width modulation, and the device exhibits excellent electrostatic isolation in the OFF-state because the buried gates laterally extend the depletion region under the 2DEG plane 34.

A top view of the HEMT shown in FIGS. 2a and 2b is shown in FIG. 2c; gate head portion 44 is not shown for clarity. Here, electrons flow between the buried gate structures 42, with the width of the channels ($W_{ch}$) controlled by the depletion 46 induced by the sides of buried gate structures 42, and by the pitch ("$P_{g-g}$") between adjacent buried gate structures. The preferably nanometer-scale parallel channels reduce self-heating during large signal operation by spatially distributing the heat sources.

When the FET is a HEMT as illustrated in FIGS. 2a-2c, the channel layer comprises a 2DEG plane. For this type of FET, the bottoms of buried gate structures 42 should be buried at least to the bottom of the 2DEG plane. As the 2DEG plane occupies only the upper portion of the channel layer, the bottoms of the gate structures can be within the channel layer, or even in buffer layer 32.

The depth to which the buried gate structures should be buried depends on the device type. As noted above, for a HEMT, the bottoms of the gate structures should be buried to a depth at least equal to the bottom of the current-carrying 2DEG plane in the channel layer. If the device is a MESFET, the buried gate structure could be buried to a depth at least equal to the bottom of the channel layer. In general, the buried gate structures must be buried deep enough so that they contact the current-carrying portion of the channel layer only from its sides, such that the FET's drain current is controlled by channel width modulation by lateral gating of the current-carrying layer by the buried gates structures.

As noted above, a FET employing buried gate structures as described herein controls drain current via channel width modulation, by laterally gating the channel layer. The laterally extended depletion region under the channel enhances electrostatic isolation, and reduces leakage current and drain-induced barrier lowering (DIBL) in off-state; it also reduces output conductance in on-state, thereby improving transistor gain. Effective source and drain resistances are very small (~⅕ those of planar HEMTs) because the source and drain contact width is wider than the effective channel width, thereby reducing the knee voltage. In addition, having no contact between the top of substrate 30 and head portion 44 suppresses the electron trapping effect during large signal operation, and eliminates the inverse piezoelectric effect.

The buried gate structures can have any of a number of shapes. For example, the structures may be cylindrical, as shown in FIGS. 2a-2c. They might also be, for example, rectangular (as shown in FIGS. 3, 4a, 4b, and 5, discussed below), or any other suitable shape.

As shown in FIG. 2a, the plurality of buried gate structures 42 may lie along a line which is parallel to and between the source and drain electrodes, though this is not essential. In this example, the structures are evenly spaced along said line (i.e., the buried gates have a fixed pitch). As FET characteristics such as threshold voltage vary with pitch, the fixed pitch can be selected as needed to achieve desired performance characteristics.

Figure 3:
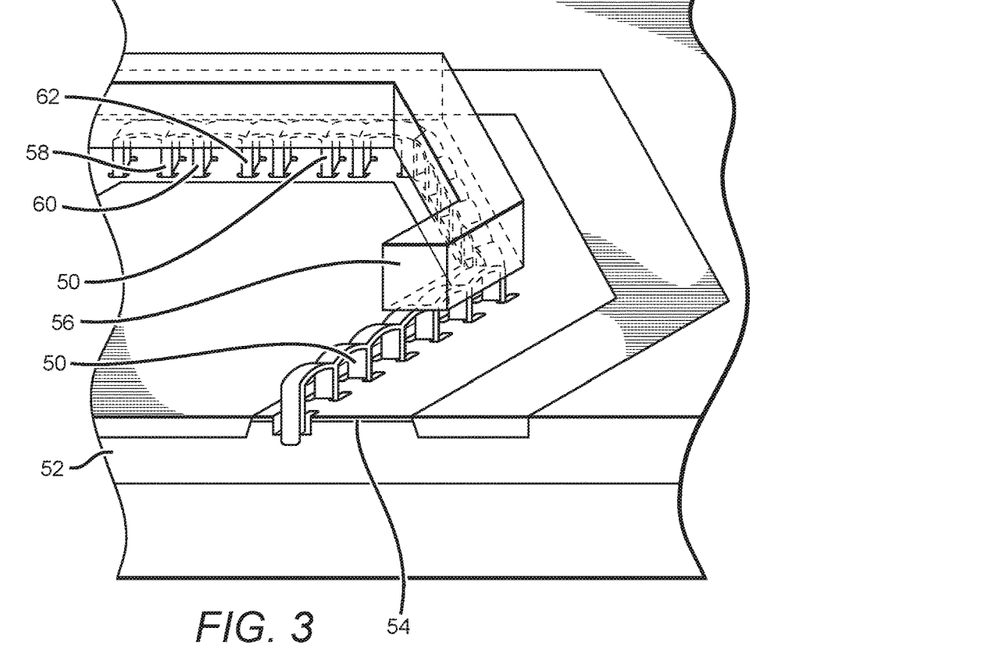
FIG. 3 is a perspective view of one possible embodiment of a FET per the present invention which employs different pitches between buried gate structures.

The buried gate structures can also be fabricated such that the pitch is not fixed, but rather varies from one pair of adjacent buried gate structures to another. This is illustrated in FIG. 3, which depicts a gate electrode in accordance with the present invention. The gate electrode comprises a plurality of buried gate structures 50, the tops of which extend above the top surface of substrate 52, and the bottoms of which are buried to a depth as described above. The gate electrode also includes a head portion 56 above and not in contact with the substrate's top surface, which contacts and interconnects all of buried gate structures 50.

In this example, buried gate structures 50 are rectangular, and do not lie along a line which is parallel to and between source and drain electrodes. In addition, the pitch between buried gate structures 50 is not constant. For example, the distance between structures 58 and 60 is different from that between structures 60 and 62. Varying the pitch in this way can be used to provide desired transfer characteristics for the FET. For example, the spacing between the buried gate structures may be selected such that, when superposed, a desired I-V curve, transconductance (gm) and its derivatives (gm2 and gm3), and/or threshold voltage ($V_{th}$) is achieved. The buried gate structures are preferably fabricated using electron beam lithography, which enables extremely accurate control of the size of the structures and the pitch between them.

Figure 4A:
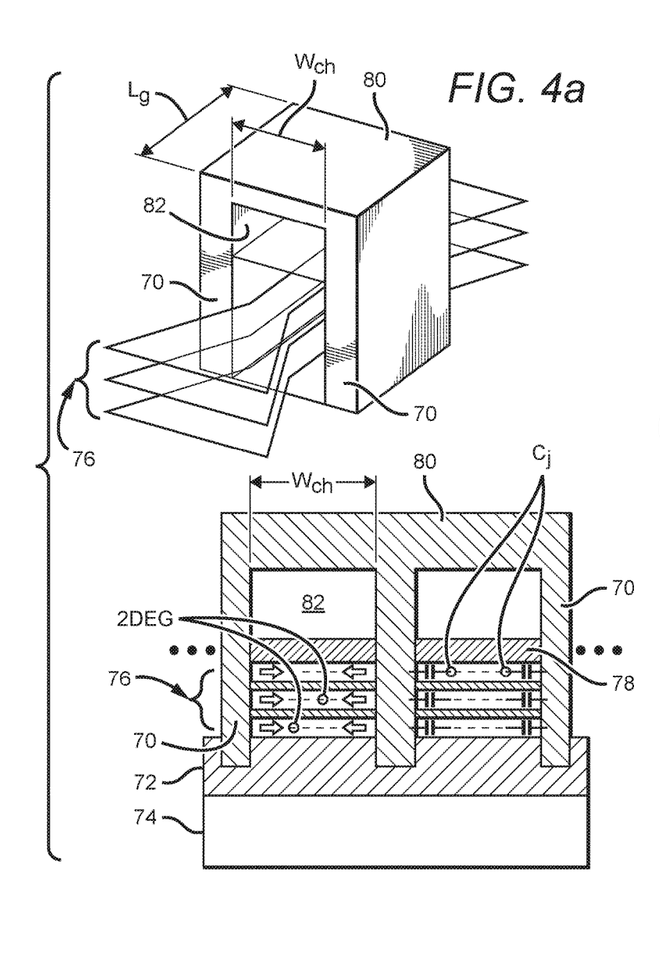
FIGS. 4a and 4b are perspective and sectional views of a FET per the present invention, with and without a dielectric material between the gate head portion and the top of the substrate.

As noted above, a FET per the present invention can be a HEMT, in which case the channel layer comprises a 2DEG channel layer and the buried gate structures are buried to a depth at least equal to the bottom of the 2DEG plane. As illustrated in the perspective and sectional views shown in FIG. 4a, the 2DEG channel layer may also be a multi-layered 2DEG channel. Buried gate portions 70 are buried in an epitaxial buffer layer 72 on a substrate 74. A multi-layered 2DEG channel 76 is between buffer layer 72 and a top barrier layer 78, and a gate electrode head portion 80 interconnects buried gate portions 70. In this exemplary embodiment there are three 2DEG layers, though there may be more or fewer layers as needed for a given application. A multi-layered 2DEG channel serves to increase current density and achievable output power (Pout) for the FET, while utilizing the high speed characteristics of 2DEG for high frequency performance, without increasing the device footprint. As illustrated in FIG. 4a, the channel layers are depleted by the buried gate structures from the sides.

Figure 4B:
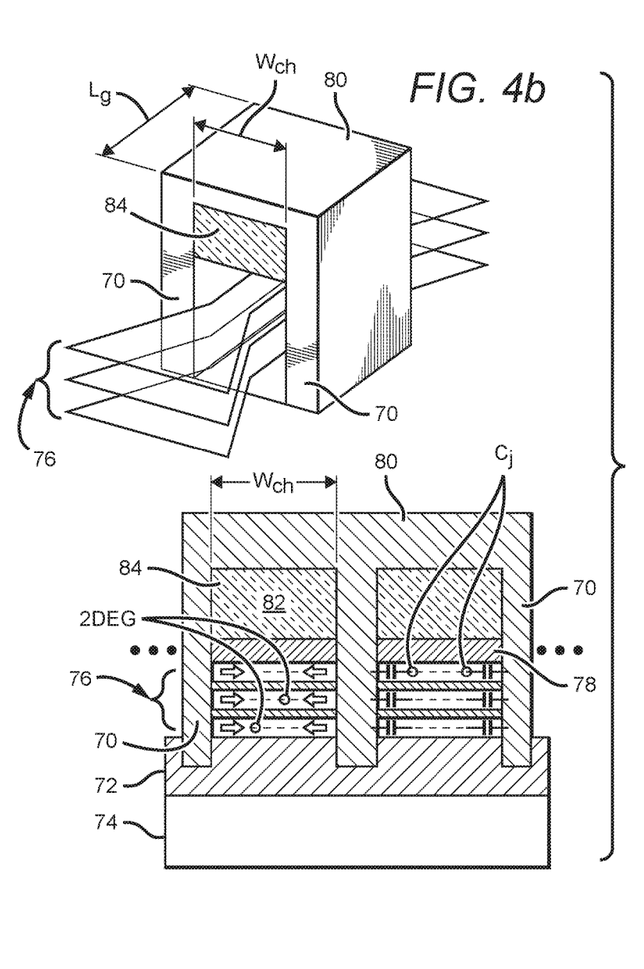

The gap 82 between the top of the substrate and the bottom of gate electrode head portion 80 may be simply an air-filled void, as shown in FIG. 4a. Alternatively, as shown in FIG. 4b, this gap may be filled with a dielectric material 84 such as SiN, $SiO_2$, or BCB. If a dielectric material is used, it should be thick enough so that head portion 80 does not modulate the FET current via the vertical gate field (through the dielectric). This condition is achieved when the capacitance associated with the head portion (denoted as Ch) is much lower than the lateral junction capacitance (denoted as Cj in FIG. 4b). Capacitance Ch is given by:

$$Ch = \text{(dielectric constant of the dielectric material)} \times Lg \times Wch / \text{(thickness of the dielectric material)}.$$

The dielectric material layer is thick enough when Ch<0.1× Cj; i.e., when Ch is less than 10% of the Cj.

Figure 5:
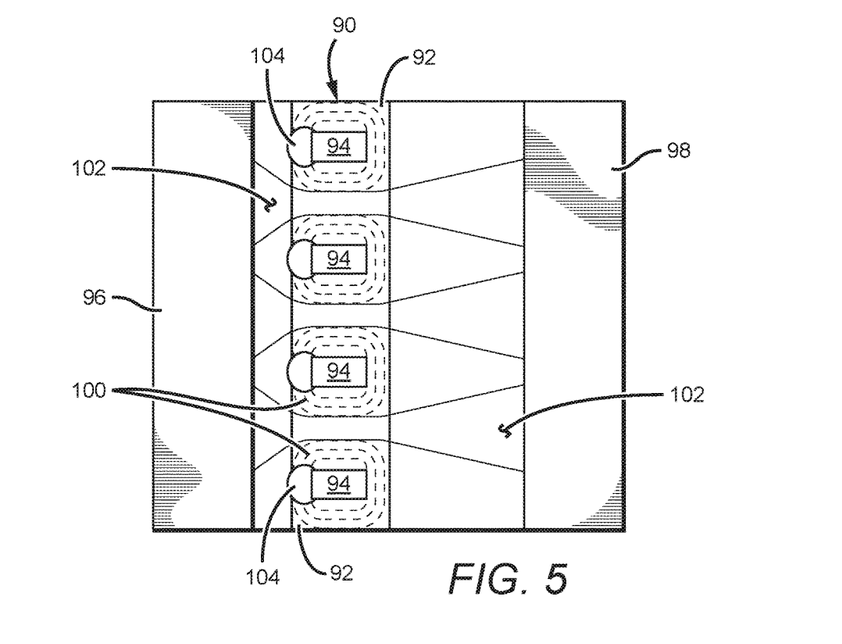
FIG. 5 is a plan view illustrating a side recess features for a FET per the present invention.

FIG. 5 is a plan view of another possible embodiment of a FET with buried gate structures as described herein. Here, a gate electrode 90 comprises a gate head portion 92 and rectangular buried gate structures 94, which are located between a source electrode 96 and a drain electrode 98. The voltage applied to gate head portion 92 controls the lateral depletion 100 of the channel layer, thereby affecting current flow 102 between the drain and source electrodes.

As shown in FIG. 5, side recesses or implant isolation 104 may be included adjacent to the buried gate structures 94, preferably on the source side of the buried gate structures. These recesses or implanted structures reduce parasitic gate-source capacitance, which improves the FET's frequency performance.

Figure 6A:
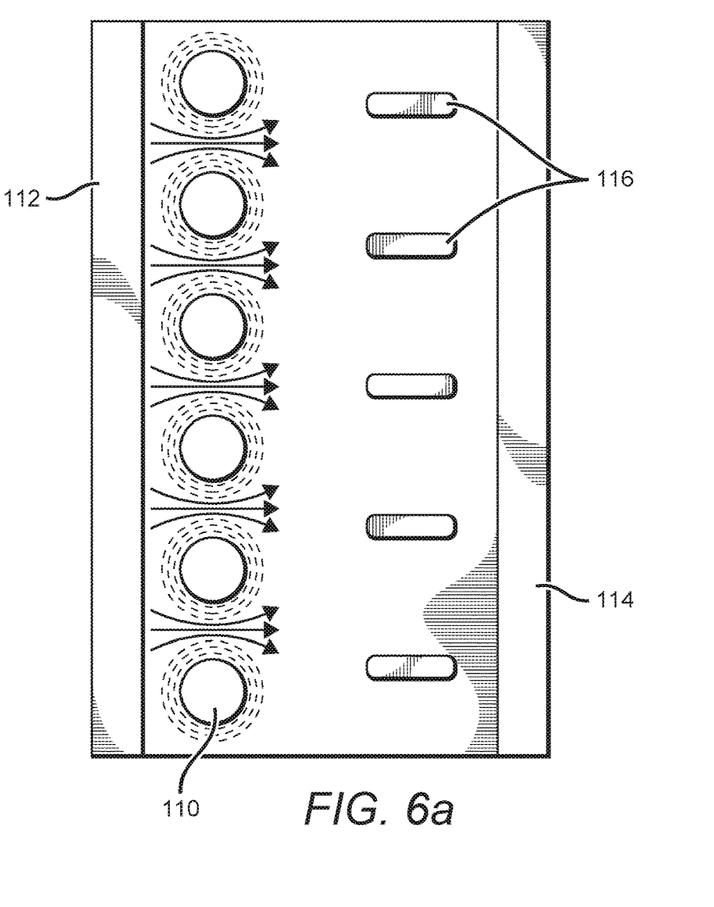
FIGS. 6a and 6b are plan and sectional views of a FET which includes a field plate per the present invention.
Figure 6B:
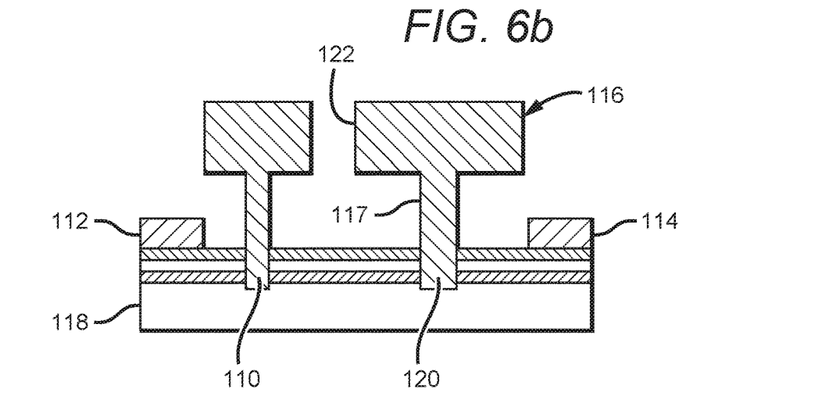

FETs in accordance with the present invention may also comprise at least one field plate between the gate and drain electrodes, each of which comprises a "slit" structure in which the field plate is divided into multiple segments. A typical embodiment is shown in FIGS. 6a and 6b. As before, a plurality of buried gate structures 110 are located between source and drain electrodes 112, 114. Here, segments 116 of a field plate lie along a line which is parallel to and between the gate and drain electrodes, with the tops of the segments 117 extending above the top surface of the substrate 118 and the bottoms of the segments 120 buried to a depth at least equal to that of the bottom of the channel layer. As with the buried gate structures, the field plate segments also comprise a field plate head portion 122 (not shown in FIG. 6a) above and not in contact with the substrate's top surface, which contacts and interconnects all of the buried segments of the field plate, such that the segments together act as a single field plate. Field plates having a slit structure, as described herein, improve the FET's breakdown voltage and dynamic on-resistance. The pitch between field plate segments preferably differs from that of the buried gate structures; this serves to reduce the strength of the electric field at the drain end of the gate; thereby mitigating some of the field strength-related problems noted above.

In practice, the FET formed by the source, drain, and buried gate structures 110 functions as a first FET, and the field plate segments 116 operate as a gate electrode for a second FET connected in series with the first FET. As noted above, the spacing between buried gate structures 110 affects the threshold voltage of the overall device. However, the spacing between field plate segments 116 can be selected to provide a desired threshold voltage for the second FET. The slit field plate is typically connected to the gate or source electrodes.

The buried gate structures can be made from a number of different materials, including, for example, metals (such as Pt, Ni, Au), p-type semiconductors (p-type NiO material, p-type GaN material, p-type CuS material, or a stack comprising a gate dielectric and a metal (such as $Al_2O_3$/Pt, $HfO_2$/Pt). The buried gate material can be deposited using, for example, atomic layer deposition (ALD). If p-type semiconductor material is used, normally-off operation (no drain current at zero-gate bias) is provided, which is preferred for power switch applications.

As noted above, the present FET structure may be used to form, for example, HEMTs or MESFETs. HEMTs that might employ the device structure described herein might be formed from various combinations of substrates and epitaxial layer materials. Several possible material combinations are listed below; other combinations may also be possible.

1. AlGaN barrier/GaN channel/GaN or AlGaN buffer on SiC, Si, GaN, AlN, sapphire, or diamond substrate
2. AlGaAs barrier/InGaAs channel/GaAs or AlGaAs buffer on GaAs substrate
3. InAlAs barrier/InGaAs channel/InP or InAlAs buffer on InP substrate
4. $(AlGa)_2O_3$ barrier/$Ga_2O_3$ channel/$Ga_2O_3$ buffer on $Ga_2O_3$ substrate The present device structure might also be a feature of a MESFET, which would typically include an epitaxial buffer layer on the substrate and an epitaxial channel layer on the buffer layer. MESFETs that employ the device structure described herein can be formed from various combinations of substrates and epitaxial layer materials. Several possible material combinations are listed below; other combinations may also be possible.

1. N-type GaN channel/GaN or AlGaN buffer on SiC, Si, GaN, AlN, sapphire, or diamond substrate
2. N-type GaAs channel/GaAs or AlGaN buffer on GaAs substrate
3. N-type InGaAs channel/InP or InAlAs buffer on InP substrate
4. N-type $Ga_2O_3$ channel/$Ga_2O_3$ buffer on $Ga_2O_3$ substrate GaN/AlGaN is a preferred material system for high power RF applications, due to its high bandgap and breakdown characteristics, and its robust reaction to strong electric fields.

As noted above, the bottoms of the present gate structures are buried to a depth at least equal to the bottom of the two-dimensional electron gas (2DEG) plane in the channel layer (for a HEMT), or to a depth at least equal to the bottom of the channel layer (for a MESFET), such that the buried gate structures contact the channel layer only from its sides.

Figure 7A:
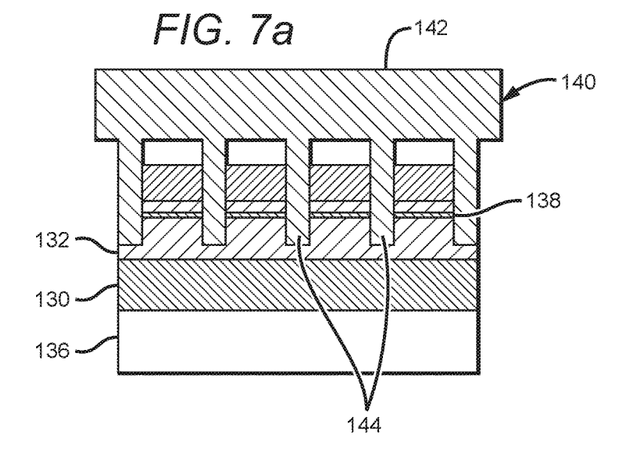
FIGS. 7a, 7b, and 7c are sectional views of different FET types, illustrating the depths to which the present gate structures should be buried.
Figure 7B:
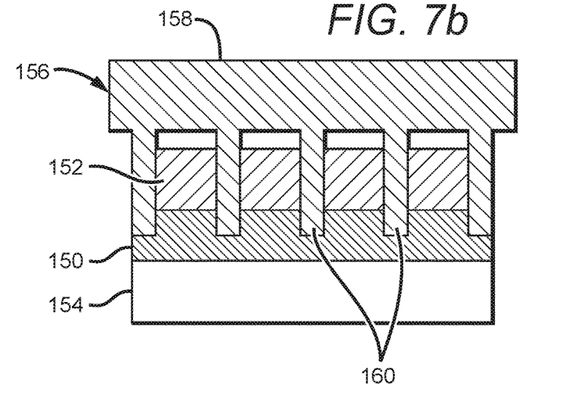

This is illustrated in FIGS. 7a and 7b. A HEMT is shown in FIG. 7a. Here, a buffer layer 130, a channel layer 132 and a top barrier layer 134 are on a substrate 136, with channel layer 132 comprising a 2DEG plane 138. A gate electrode 140 comprises a head portion 142 and a buried portion 144. For this device type, the bottom of gate electrode 140 is buried to a depth at least equal to the bottom of 2DEG plane 138.

A MESFET is shown in FIG. 7b. Here, a buffer layer 150 and a channel layer 152 are on a substrate 154. A gate electrode 156 comprises a head portion 158 and a buried portion 160. For this device type, the bottom of gate electrode 156 is buried to a depth at least equal to the bottom of channel layer 152.

Figure 7C:
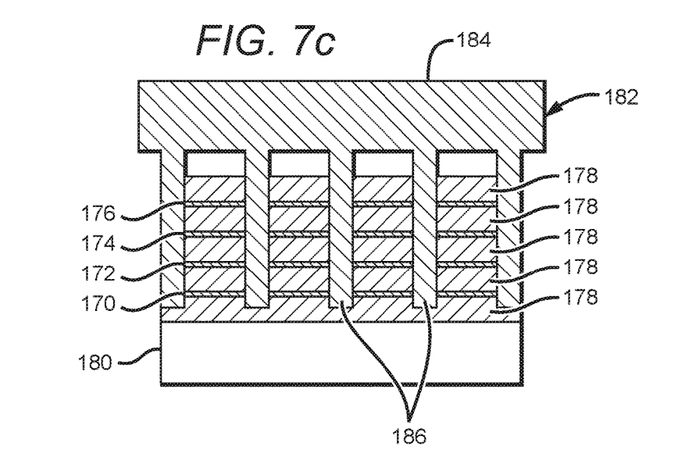

Another type of FET for which the present buried gate structures might be employed is a FET consisting of one or more two-dimensional semiconductor layers. These atomically thick layers may comprise materials such as graphene, $MoS_2$, black phosphorus, $MoSe_2$, and $WSe_2$. Such a FET can have a single or multiple two-dimensional semiconductor layers. An exemplary embodiment of such a FET is shown in FIG. 7c. Here, the device includes four two-dimensional semiconductor layers 170, 172, 174, and 176, separated from each other and from substrate 180 with dielectric layers 178; another dielectric layer 178 is preferably on uppermost two-dimensional semiconductor layer 176. As before, a gate electrode 182 includes a head portion 184 and buried gate structures 186. For this type of FET, the "current-carrying portion of the channel layer" refers to all of the two-dimensional semiconductor layers, such that the bottoms of the gate structures should be buried to a depth at least equal to the bottom of the lowermost two-dimensional semiconductor layer 170. When so arranged, the buried gate structures contact the two-dimensional semiconductor layers only from their sides, such that the PET's drain current is controlled by channel width modulation by lateral gating of the two-dimensional semiconductor layers by said buried gates structures.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A field-effect transistor (FET), comprising:
 a substrate;
 an epitaxial buffer layer on said substrate;
 an epitaxial channel layer on said buffer layer;
 source and drain electrodes on said substrate's top surface; and
 a gate electrode, comprising:
  a plurality of buried gate structures, the tops of which extend above said substrate's top surface and the bottoms of which are buried to a depth at least equal to that of the bottom of the current-carrying portion of said channel layer, such that said buried gate structures contact said channel layer only from the sides of said channel layer; and
  a head portion above and not in contact with the top surface of said substrate and any of said epitaxial layers, and which contacts and interconnects all of said buried gate structures;
 such that said FET's drain current is controlled only by channel width modulation by lateral gating of the channel layer by said buried gates structures.

2. The FET of claim 1, wherein said FET is a high electron mobility transistor (HEMT) and said current-carrying portion of said channel layer comprises a two-dimensional electron gas (2DEG) plane.

3. The FET of claim 2, further comprising an epitaxial top barrier layer above said channel layer, the bottoms of said buried gate structures buried into said buffer layer or said channel layer.

4. The FET of claim 1, wherein said buried gate structures are cylindrical.

5. The FET of claim 1, wherein said buried gate structures are rectangular.

6. The FET of claim 1, wherein said plurality of buried gate structures lie along a line which is parallel to and between said source and drain electrodes.

7. The FET of claim 6, wherein said plurality of buried gate structures are evenly spaced along said line.

8. The FET of claim 6, wherein the spacing between adjacent buried gate structures is selected to provide a desired set of performance characteristics for said FET.

9. The FET of claim 8, wherein the spacing between said adjacent buried gate structures is selected to provide a desired threshold voltage for said FET.

10. The FET of claim 6, wherein the spacing between adjacent buried gate structures varies along said line as needed to provide desired transfer characteristics for said FET.

11. The FET of claim 1, wherein said FET is a high electron mobility transistor (HEMT) and said channel layer comprises a multi-layered 2DEG channel, said buried gate structures buried to a depth at least equal to the bottom of said multi-layered 2DEG channel.

12. The FET of claim 1, wherein said FET is a metal-semiconductor field-effect transistor (MESFET), comprising:
 an epitaxial buffer layer on said substrate; and
 said channel layer on said buffer layer.

13. The FET of claim 1, wherein said buried gate structures comprise metals, or p-type semiconductors (p-type NiO material, p-type GaN material, p-type CuS material, or a stack comprising a gate dielectric and a metal.

14. The FET of claim 13, wherein said metals comprise Pt, Ni, or Au.

15. The FET of claim 13, wherein said stack comprises $Al_2O_3$/Pt or $HfO_2$/Pt.

16. The FET of claim 1, wherein said buried gate structures comprise p-type NiO material.

17. The FET of claim 1, wherein said buried gate structures comprise p-type GaN material.

18. The FET of claim 1, wherein said buried gate structures comprise p-type CuS material.

19. The FET of claim 1, further comprising a dielectric material between said substrate's top surface and said head portion.

20. The FET of claim 19, wherein said dielectric material comprises SiN, $SiO_2$, or BCB.

21. The FET of claim 1, further comprising side recesses or side implanted regions adjacent to and on the source side of said buried gate structures, such that parasitic gate-source capacitance that might otherwise be present is reduced.

22. A high electron mobility transistor (HEMT), comprising:
 a substrate;
 an epitaxial buffer layer on said substrate;
 an epitaxial channel layer comprising a 2DEG plane formed inside the channel layer on said buffer layer;
 an epitaxial top barrier layer on said channel layer;

source and drain electrodes on the top surface of said top barrier layer; and a gate electrode, comprising:
- a plurality of buried gate structures, the tops of which extend above said top barrier layer's top surface and the bottoms of which are buried to a depth at least equal to that of the bottom of said 2DEG plane, such that said buried gate structures contact said 2DEG channel layer only from the sides of said 2DEG channel layer; and
- a head portion above and not in contact with said top barrier layer's top surface or any of said epitaxial layers, and which contacts and interconnects all of said buried gate structures;

such that said HEMT's drain current is controlled only by channel width modulation by lateral gating of said 2DEG channel layer by said buried gate structures.

23. The HEMT of claim 22, wherein said channel layer comprises a multi-layered 2DEG channel, said buried gate structures buried to a depth at least equal to the bottom of said multi-layered 2DEG channel.

24. A metal-semiconductor field-effect transistor (MESFET), comprising:

a substrate;

an epitaxial buffer layer on said substrate;

an epitaxial channel layer on said buffer layer;

source and drain electrodes on the top surface of said channel layer; and a gate electrode, comprising:
- a plurality of buried gate structures, the tops of which extend above the top surface of said substrate and any of said epitaxial layers, and the bottoms of which are buried to a depth at least equal to that of the bottom of said channel layer, such that said buried gate structures contact said channel layer only from the sides of said channel layer; and
- a head portion above and not in contact with said channel layer's top surface which contacts and interconnects all of said buried gate structures;

such that said MESFET's drain current is controlled only by channel width modulation by lateral gating of said channel layer by said buried gate structures.

* * * * *

UNITED STATES PATENT AND TRADEMARK OFFICE
CERTIFICATE OF CORRECTION

PATENT NO. : 10,388,746 B2
APPLICATION NO. : 15/643343
DATED : August 20, 2019
INVENTOR(S) : Keisuke Shinohara et al.

It is certified that error appears in the above-identified patent and that said Letters Patent is hereby corrected as shown below:

In the Specification

After TITLE, add:
GOVERNMENT RIGHTS
This invention was made with Government support under FA8650-13-C-7313 awarded by Air Force Research Laboratory – WPAFB. The Government has certain rights in the invention.

Signed and Sealed this
Twenty-fourth Day of September, 2019

Andrei Iancu
*Director of the United States Patent and Trademark Office*